United States Patent [19]
Stevens et al.

[11] Patent Number: 6,120,641
[45] Date of Patent: Sep. 19, 2000

[54] PROCESS ARCHITECTURE AND MANUFACTURING TOOL SETS EMPLOYING HARD MASK PATTERNING FOR USE IN THE MANUFACTURE OF ONE OR MORE METALLIZATION LEVELS ON A WORKPIECE

[75] Inventors: E. Henry Stevens, Colorado Springs, Colo.; Robert W. Berner, San Jose, Calif.

[73] Assignee: Semitool, Inc., Kalispell, Mont.

[21] Appl. No.: 09/128,238

[22] Filed: Aug. 3, 1998

Related U.S. Application Data

[63] Continuation-in-part of application No. 09/076,695, May 12, 1998.

[51] Int. Cl.$^7$ ................................................. H01L 21/00
[52] U.S. Cl. ......................................... 156/345; 118/719
[58] Field of Search .............................. 216/18; 156/345; 118/719

[56] References Cited

U.S. PATENT DOCUMENTS

| | | |
|---|---|---|
| 5,162,260 | 11/1992 | Leibovitz et al. . |
| 5,316,974 | 5/1994 | Crank . |
| 5,723,387 | 3/1998 | Chen ........................................ 156/345 |

*Primary Examiner*—Thi Dang
*Attorney, Agent, or Firm*—Rockey, Milnamow & Katz, Ltd.

[57] ABSTRACT

A manufacturing tool configuration for applying one or more levels of interconnect metallization to a generally planar dielectric surface of a workpiece with a minimal number of workpiece transfer operations between the tool sets is disclosed. The tool configuration comprises a film deposition tool set, a hard mask formation tool set, a hard mask etching tool set, a pattern processing tool set, a wet processing tool set, and a dielectric processing tool set. The film deposition tool set is used to deposit a conductive barrier layer exterior to the planar dielectric surface of the workpiece and a conductive seed layer exterior to the barrier layer. The hard mask formation tool set is used to form a hard mask dielectric layer exterior to the seed layer in accordance with one of the disclosed processes, and to form a still further hard mask dielectric layer exterior to the hard mask dielectric layer. In accordance with a first disclosed process, the pattern processing tool set is used to provide an interconnect line pattern over the hard mask dielectric layer and to provide a post pattern over interconnect line metallization formed using the interconnect line pattern. In accordance with a second disclosed process, the pattern processing tools set is used to provide a post pattern over the further hard mask dielectric layer so that the post pattern is ultimately formed in the further hard mask dielectric layer. The hard mask etching tool set is used to etch exposed regions of the hard mask dielectric layer after formation of the interconnect line pattern thereover and, in accordance with the second disclosed process, the exposed portions of the further hard mask dielectric layer after the formation of the post pattern thereover. The wet processing tool set performs at least the following wet processing operations: 1) applying copper metallization, using an electrochemical deposition process, into the interconnect line pattern and the post pattern formed by the pattern processing tool set, 2) removing material applied by the pattern processing tool set to form the interconnect line pattern and the post pattern, 3) removing the hard mask dielectric layer and, if necessary, the further hard mask dielectric layer, and 4) removing portions of the seed layer and the barrier layer that are not overlied by interconnect line metallization. The dielectric processing tool set is used to deposit a dielectric layer over the interconnect line metallization and post metallization and for etching the deposited dielectric layer to expose upper connection regions of the post metallization. In accordance with one embodiment of the tools set architecture, an inspections tools set is also employed to inspect the workpiece at intermediate stages of the processing.

47 Claims, 12 Drawing Sheets

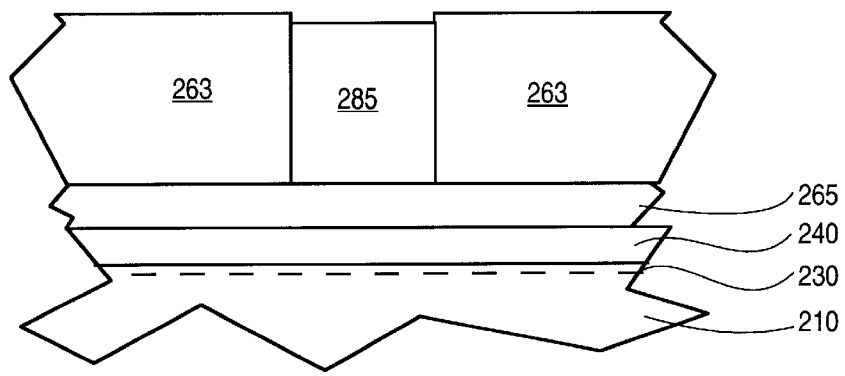
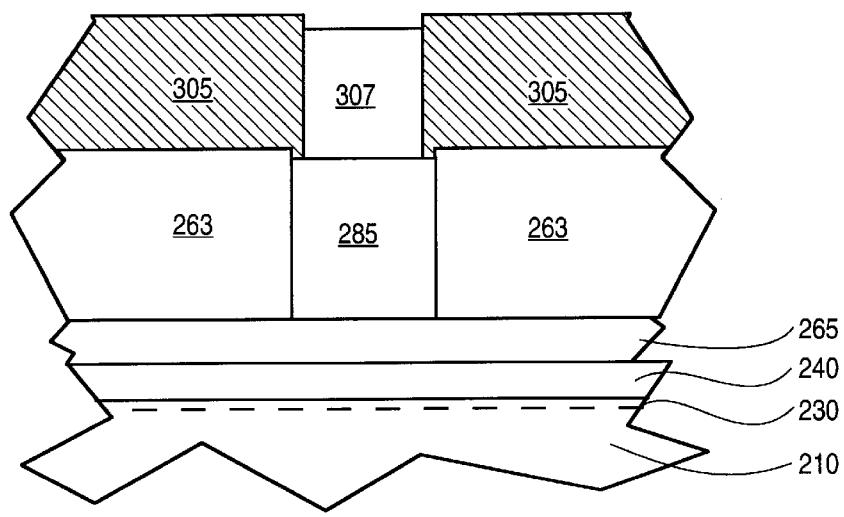
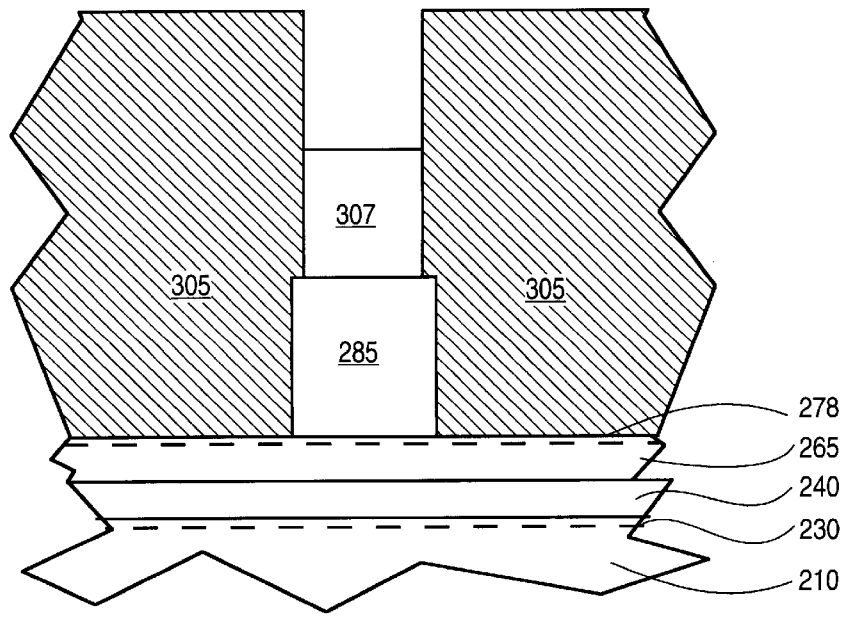

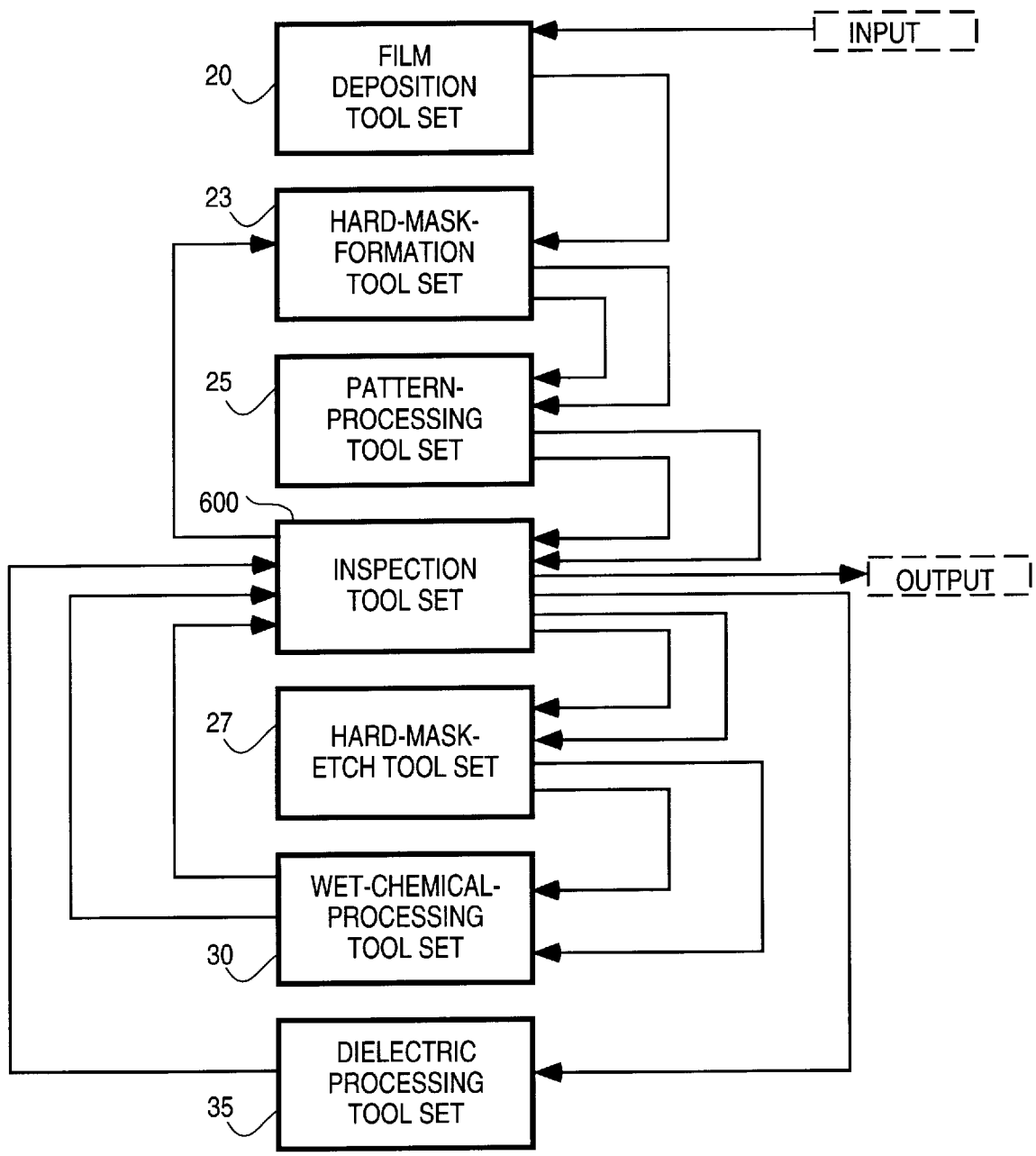

PROCESS ARCHITECTURE AND MANUFACTURING TOOL SETS EMPLOYING HARD MASK PATTERNING FOR USE IN THE MANUFACTURE OF ONE OR MORE METALLIZATION LEVELS ON A WORKPIECE

CROSS-REFERENCE TO RELATED APPLICATIONS

This application is a continuation-in-part of U.S. Ser. No. 09/076,695, filed May 12, 1998.

STATEMENT REGARDING FEDERALLY SPONSORED RESEARCH OR DEVELOPMENT

Not Applicable

BACKGROUND OF THE INVENTION

An integrated circuit is an interconnected ensemble of devices formed within a semiconductor material and within a dielectric material that overlies a surface of the semiconductor material. Devices which may be formed within the semiconductor material include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single dice limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given by the equation:

$$\tau = RC[1+(V_{SAT}/RI_{SAT})]$$

In this equation, R and C are, respectively, an equivalent resistance and capacitance for the interconnect path, and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_e$, of the dielectric material. A small value of $\theta$ requires that the interconnect line carry a current density sufficiently large to make the ratio $V_{SAT}/RI_{SAT}$ small. It follows, therefore, that a low-$\rho$ conductor which can carry a high current density and a low-$K_e$ dielectric should be utilized in the manufacture of high-performance integrated circuits.

To meet the foregoing criterion, copper interconnect lines within a low-$K_e$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 $\mu\Omega$cm. while resistivities of aluminum-alloy films are higher in the range of 3.0 to 3.5 $\mu\Omega$cm.

Despite the advantageous properties of copper, several problems must be addressed for copper interconnects to become viable in large-scale manufacturing processes.

Diffusion of copper is one such problem. Under the influence of an electric field, and at only moderately elevated temperatures, copper moves rapidly through silicon oxide. It is believed that copper also moves rapidly through low-$K_e$ dielectrics. Such copper diffusion causes failure of devices formed within the silicon.

Another problem is the propensity of copper to oxidize rapidly when immersed in aqueous solutions or when exposed an to oxygen-containing atmosphere. Oxidized surfaces of the copper are rendered non-conductive and thereby limit the current carrying capability of a given conductor path when compared to a similarly dimensioned non-oxidized copper path.

A still further problem with using copper in integrated circuits is that it is difficult to use copper in a multi-layer, integrated circuit structure with dielectric materials. Using traditional methods of copper deposition, copper adheres only weakly to dielectric materials.

Finally, because copper does not form volatile halide compounds, direct plasma etching of copper cannot be employed in fine-line patterning of copper. As such, copper is difficult to use in the increasingly small geometries required for advanced integrated circuit devices.

The semiconductor industry has addressed some of the foregoing problems and has adopted a generally standard interconnect architecture for copper interconnects. To this end, the industry has found that fine-line patterning of copper can be accomplished by etching trenches and vias in a dielectric, filling the trenches and vias with a deposition of copper, and removing copper from above the top surface of the dielectric by chemical-mechanical polishing (CMP). An interconnect architecture called dual damascene can be employed to implement such an architecture and thereby form copper lines within a dielectric. FIG. 1 illustrates the process steps generally required for implementing the dual damascene architecture.

The present inventor has found that the dual damascene architecture may often be difficult for semiconductor manufacturers to implement in large-scale manufacturing processes. It is difficult to deposit a thin silicon nitride etch-stop layer without damaging the underlying low $K_e$ material. The art of plasma etching dielectric materials is well established, but etching sub-half-micrometer features in a low-$K_e$ dielectric while maintaining selectivity to silicon nitride is difficult.

There are at least two processes in the formation of the dual-damascene architecture that are particularly troublesome. First, deposition of thin, uniform barrier and seed layers into high aspect ratio (depth/diameter) vias and high aspect ratio (depth /width) trenches is difficult. The upper portions of such trenches and vias tend to pinch-off before the respective trench and/or via is completely filled or layered with the desired material. Further, CMP and the associated cleaning procedures are especially complex and difficult to implement.

In addition to its difficulty and complexity, the dual damascene architecture imposes limitations on interconnect performance. The etch-stop layer, typically comprised of silicon nitride, has a high dielectric permittivity; thus, unless the etch-stop layer is very thin compared to the line thickness, capacitance between metal lines in the same interconnect level is dominated by coupling through the etch stop. Conductivities of known barrier materials are negligible compared to the conductivity of copper; thus the conductance of narrow interconnect lines is markedly reduced by the barrier layer that must be interposed between the copper and dielectric.

A processing tool architecture suitable for implementing the dual-damascene process steps illustrated in FIG. 1 is shown in FIG. 2. As illustrated in FIG. 2, the dual damascene architecture can be implemented with ten tool sets. Formation of each interconnect level generally requires two precision photolithographic processes, two precision etches, four dielectric depositions, barrier and seed layer depositions, a copper deposition, CMP and a post-CMP clean. Both small vias and small trenches must be etched; thus, an etch tool is required to define via features in the silicon nitride film, and a second etch tool is required to define via openings and trench features in the low-$K_e$ dielectric. Using the traditional processing tool architecture of FIG. 2, the formation of each metallization level requires at least 13 workpiece movements among the tool sets.

The substantial number of wafer movements used to form a dual-damascene interconnect metallization structure reduces the reliability and yield of to manufacturing process. As the number of wafer movements increases, so does the potential for mis-handling of one or more wafers. Further, implementing a manufacturing facility for applying dual-damascene interconnect metallization structures requires a substantial capital outlay for above purchase of the required tool sets. Such reliability and capital equipment outlay issues are addressed by the present invention.

BRIEF SUMMARY OF THE INVENTION

A manufacturing tool configuration for applying one or more levels of interconnect metallization to a generally planar dielectric surface of a workpiece with a minimal number of workpiece transfer operations between the tool sets is disclosed. The tool configuration comprises a film deposition tool set, a hard mask formation tool set, a hard mask etching tool set, a pattern processing tool set, a wet processing tool set, and a dielectric processing tool set. The film deposition tool set is used to deposit a conductive barrier layer exterior to the planar dielectric surface of the workpiece and a conductive seed layer exterior to the barrier layer. The hard mask formation tool set is used to form a hard mask dielectric layer exterior to the seed layer in accordance with one of the disclosed processes, and to form a still further hard mask dielectric layer exterior to the hard mask dielectric layer. In accordance with a first disclosed process, the pattern processing tool set is used to provide an interconnect line pattern over the hard mask dielectric layer and to provide a post pattern over interconnect line metallization formed using the interconnect line pattern. In accordance with a second disclosed process, the pattern processing tools set is used to provide a post pattern over the further hard mask dielectric layer so that the post pattern is ultimately formed in the further hard mask dielectric layer. The hard mask etching tool set is used to etch exposed regions of the hard mask dielectric layer after formation of the interconnect line pattern thereover and, in accordance with the second disclosed process, the exposed portions of the further hard mask dielectric layer after the formation of the post pattern thereover. The wet processing tool set performs at least the following wet processing operations: 1) applying copper metallization, using an electrochemical deposition process, into the interconnect line pattern and the post pattern formed by the pattern processing tool set, 2) removing material applied by the pattern processing tool set to form the interconnect line pattern and the post pattern, 3) removing the hard mask dielectric layer and, if necessary, the further hard mask dielectric layer, and 4) removing portions of the seed layer and the barrier layer that are not overlied by interconnect line metallization. The dielectric processing tool set is used to deposit a dielectric layer over the interconnect line metallization and post metallization and for etching the deposited dielectric layer to expose upper connection regions of the post metallization.

In accordance with a specific embodiment of the tool set architecture, an inspection tool set may also be included. The workpieces are transferred to the inspection apparatus at various intermediate stages of the metallization process to insure, for example, proper registration of the pattern layers and resulting metallization structures. In such instances, a single metallization level may be formed using no more than ten workpiece movements between the tool sets.

A single metallization level may be formed using a plurality of workpiece movements between the tool sets. Preferably, no more than fourteen workpiece movements between the tool sets are used when an inspection tool set is employed. Even more preferably, no more than seven workpiece movements between the tool sets are used.

BRIEF DESCRIPTION OF THE SEVERAL VIEWS OF THE DRAWINGS

FIGS. 7–9 illustrate an interconnect metallization structures formed using the process of FIG. 6 at selected stages of the metallization level development.

FIGS. 14 and 15 illustrate a tool set configuration and corresponding workpiece movements for implementing the processes shown in FIGS. 6 and 10, respectively, wherein an inspection tool set is used to check the workpieces at intermediate stages of the metallization processing.

DETAILED DESCRIPTION OF THE INVENTION

Figure 1:
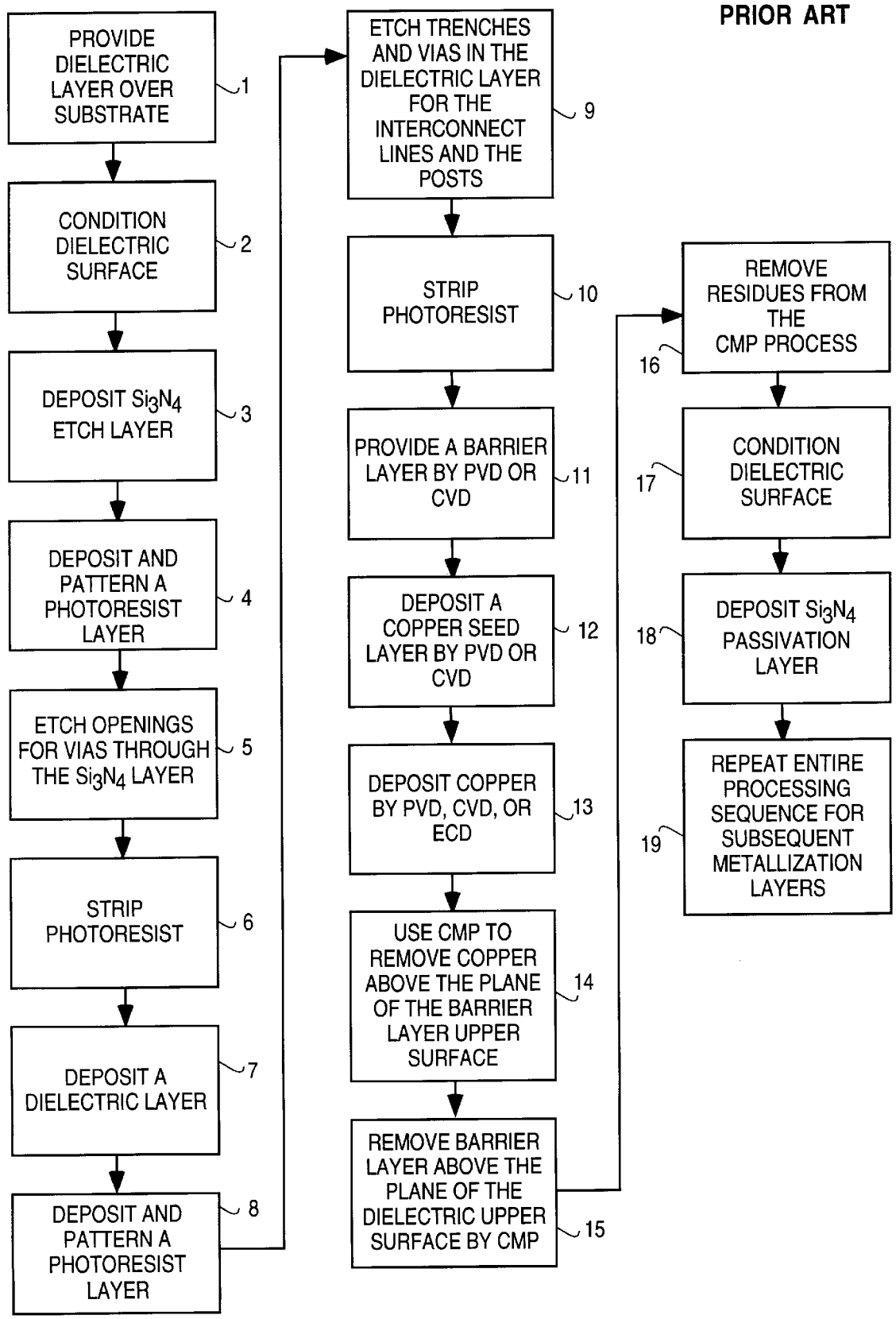
FIG. 1 is a process flowchart illustrating one manner of forming a dual-damascene interconnect structure.

A basic understanding of certain terms used herein will assist the reader in understanding the disclosed subject matter. To this end, basic definitions of certain terms, as used in the present disclosure, are set forth below.

Single Metallization Level is defined as a composite level of a workpiece that is exterior to the substrate. The composite level comprises one or more interconnect lines and one or more interconnect posts that are substantially covered by a dielectric layer so that the dielectric layer insulates selected interconnect lines and interconnect posts that are not designed to be interconnected from one another.

Substrate is defined as a base layer of material over which one or more metallization levels are disposed. The substrate may be, for example, a semiconductor wafer, a ceramic block, etc.

Tool Set is defined as comprising input and output stations (either separated or combined into a single I/O station) and one or more processing stations that are preferably grouped in an advantageous manner. The various stations are integrated by one or more transfer devices that transfer workpieces between the processing stations and the input and output stations and between processing stations.

Workpiece is defined as an object that at least comprises a substrate, and may include further layers of material or manufactured components, such as one or more metallization levels, disposed on the substrate.

The present invention employs a novel approach to applying copper metallization to a workpiece, such as a semiconductor article. The approach results in a copper metallization level that is readily manufactured using a minimal number of processing tool sets and a minimal number of workpiece movements between the tool sets. The manufacturing process steps used to construct the resulting copper interconnect level avoid many of the inherently problematic processing steps associated with damascene interconnect structures. For example, seed layers, copper metallization layers, and barrier layers no longer need to be deposited into high aspect ratio trenches and vias using non-conformal vapor deposition processes. Rather, the barrier and metal seed layers are preferably applied to the workpiece in a blanket deposition process over generally planarized surfaces of the workpiece. Subsequent deposition of the copper metallization used to form at least the lines is accomplished using an electrochemical deposition process in which the copper is deposited beginning at the bottom of an opening in a patterned hard mask layer, thereby ensuring that the resulting line is completely formed and eliminating the pinch-off problems associated with the three-dimensional filling of the trench and via employed in damascene processing. Similarly, deposition of the copper metallization used to form the posts is accomplished using an electrochemical deposition process in which the copper is deposited beginning at the bottom of an opening in either a patterned hard mask layer or a patterned photoresist layer. The use of patterned hard mask layers in the copper deposition process may be advantageous for producing extremely small metallization structures that have low placement error tolerances. Further, chemical mechanical polishing processes may be avoided in favor of electrochemical planarization and/or etching processes.

Manufacturing of the disclosed interconnect level architecture is accomplished with a minimal number of workpiece processing tool sets and with a minimal number of workpiece movements between the tool sets. As such, the cost of capital equipment in the design of a manufacturing facility used for the generation of such interconnects structures may be minimized. Further, by reducing the number of workpiece movements between the tool sets, the risk of damage to the workpieces is substantially decreased.

At least four embodiments of a process for manufacturing a metallization level are disclosed. In a first embodiment, only the interconnect metallization pattern is formed using a hard mask dielectric layer. In a second embodiments, both the interconnect metallization pattern and the post pattern are formed using hard mask dielectric layers. The third and fourth process embodiments are respectively similar to the first and second process embodiments, except that intermediate inspections are performed during the processing to ensure proper formation of the interconnect line and post patterns. Processing architectures, processing tool sets, and workpiece movements are set forth with respect to each of the process embodiments.

Figure 3:
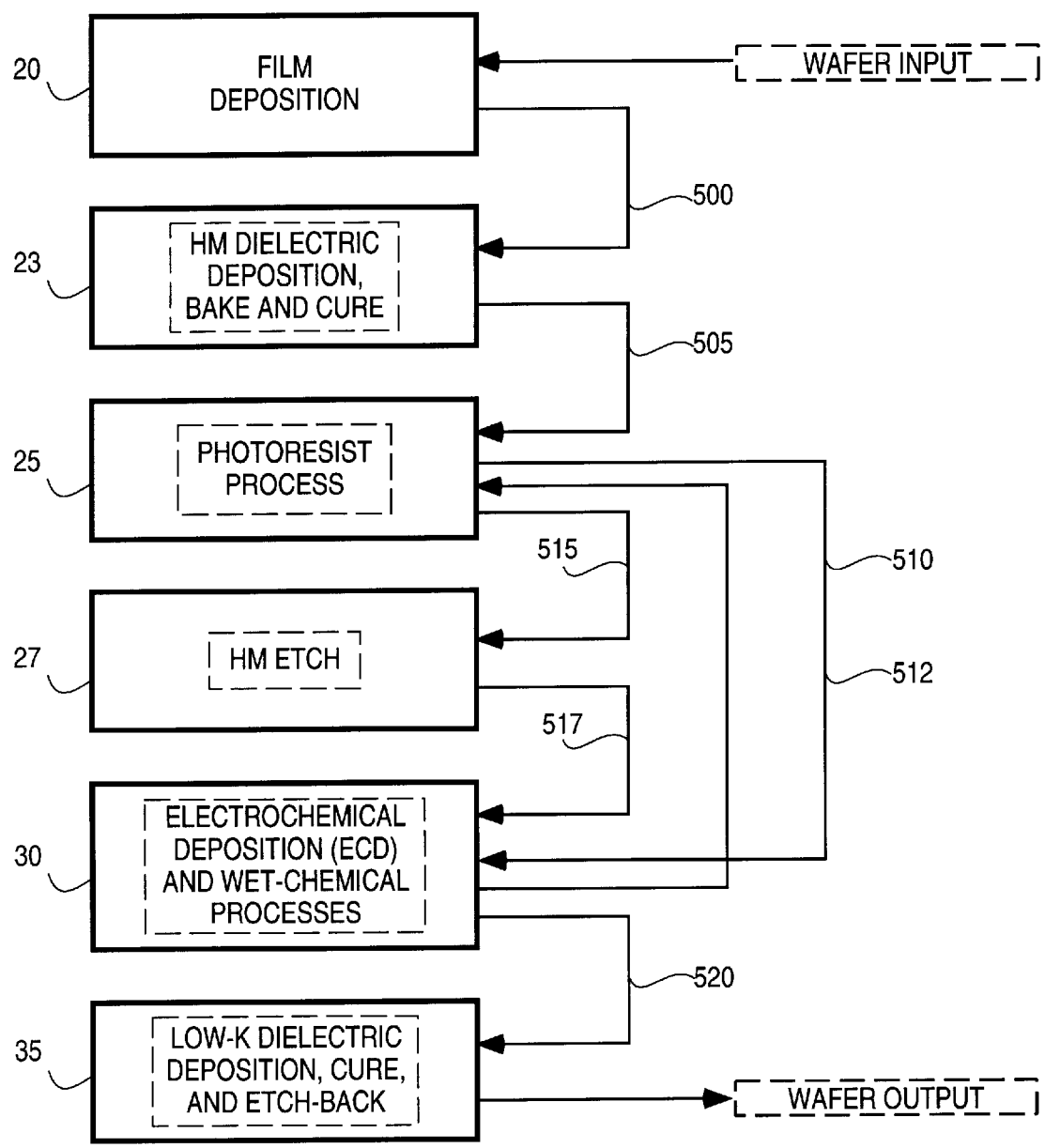
FIG. 3 illustrates one manner of configuring tool set configuration for implementing a process architecture of the present invention.

The basic tool sets for implementing a process architecture in accordance with one embodiment of the present invention are illustrated in FIG. 3. As shown, the tool sets comprise a film deposition tool set 20, a hard mask formation tool set 23, a pattern processing tool set 25, a hard mask etch tool set 27, an electrochemical/wet processing tool set 30, and a dielectric processing tool set 35.

In the disclosed embodiment of FIG. 3, the film deposition tool set 20 is preferably a vacuum deposition tool set. As will become apparent from the subsequent discussion of the processing operations performed on the workpiece, the film deposition tool set 20 deposits one or more films on generally planar surfaces of the workpiece. Such film deposition is preferable to depositing the films in the micro-recessed features employed in damascene processing. As such, low cost vacuum deposition techniques, such as physical vapor deposition (PVD), may be employed. Chemical vapor deposition (CVD) processes may also be employed.

Figure 4:
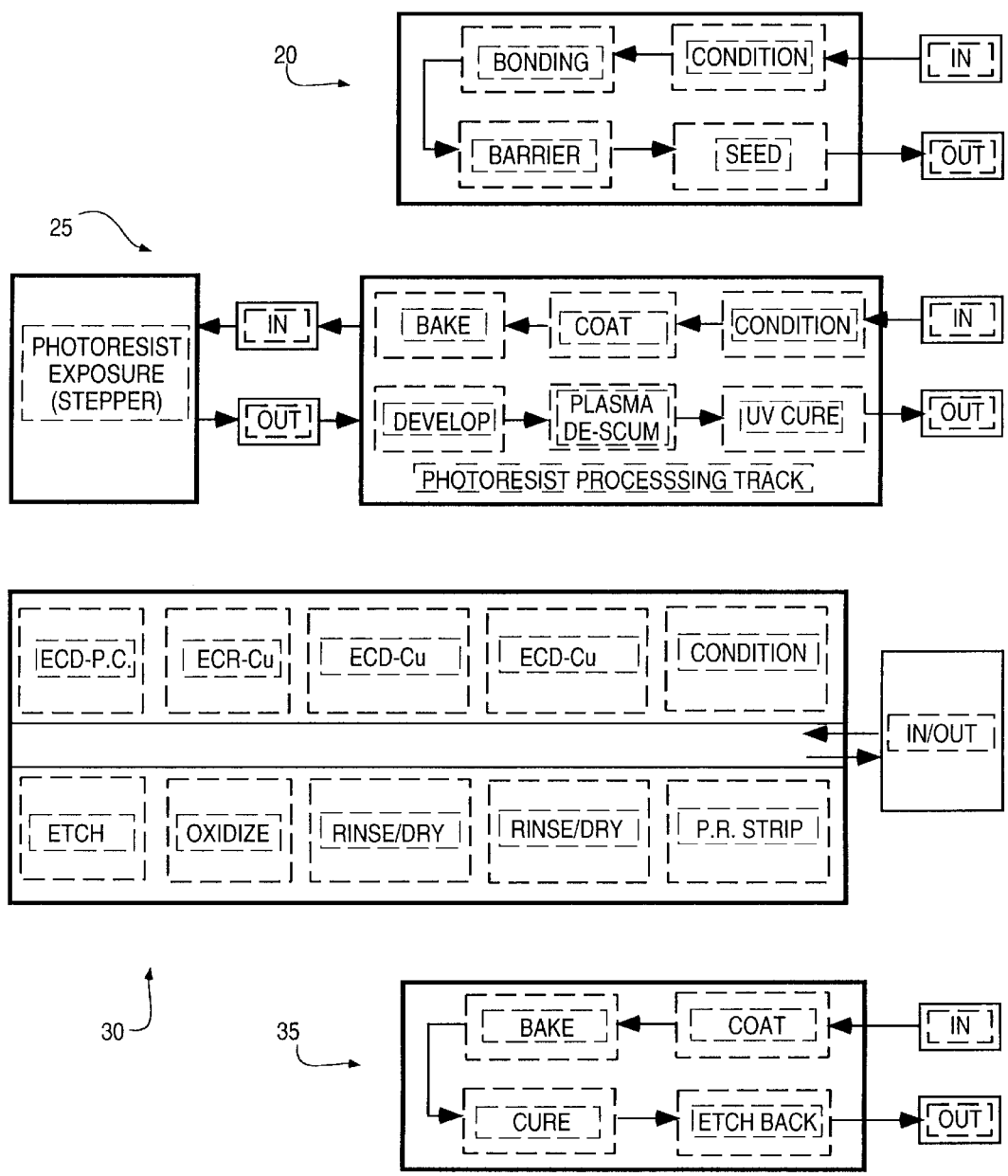
FIGS. 4 and 5 illustrate specific embodiments of tools sets that may be used in the tool set configuration of FIG. 3.

A particular embodiment of the film deposition tool set 20 shown in FIG. 4 includes a plurality of processing stations for conditioning a surface of the workpiece, depositing a bonding layer, depositing a barrier layer, and depositing a seed layer on the workpiece. Preferably, the workpieces are first transferred to a conditioning station where the surface of a generally planar dielectric layer disposed exterior to the workpiece substrate is treated to enhance adhesion of a subsequent film layer. Such adhesion enhancement of the dielectric layer can be accomplished using any one or more known plasma processes. Depending on the characteristics of the dielectric layer and the subsequent film layer, adhesion enhancement may not be necessary. In such instances, a conditioning station need not be included in the film deposition tool set 20. Each workpiece is then provided to a bonding film application station where an optional bonding layer is applied exterior to (preferably, directly on) the dielectric layer. Materials suitable for the bonding layer include aluminum, titanium, and chromium. Depending on the properties of adjacent film layers, the bonding layer may not be desired and, as such, a bonding film application station need not be included in the film deposition tool set 20. A barrier layer application station is used to apply a barrier layer material exterior to the dielectric material of the workpiece. Depending on properties of other materials incorporated within the interconnect structure, the barrier layer may be comprised of tantalum, tantalum nitride, titanium nitride, titanium oxynitride, titanium-tungsten alloy, or tungsten nitride. Particularly when the interconnect level makes contact to terminals of semiconductor devices, it is advantageous to employ a composite barrier comprised of two layers, as taught by Stevens in U.S. Pat. No. 4,977,440 and in U.S. Pat. No. 5,070,036.

To augment the conductivity of the barrier layer and to provide for good adhesion of subsequently formed layers, the film deposition tool set 20 preferably includes a seed layer application station. The seed layer application station preferably deposits the seed layer using a PVD or CVD process. The seed layer is preferably copper. After the seed layer has been applied, the workpieces are transferred to an output station for subsequent transfer to other processing tool sets.

The hard mask formation tool set 23 includes a plurality of processing stations which are used to provide a hard mask dielectric layer over the seed layer applied by the film deposition processing tool set 20. This hard mask dielectric layer is ultimately patterned in accordance with a photoresist pattern applied by the pattern processing tool set 25. One or more hard mask layers are applied to provide the patterned masks used for depositing one or both of the interconnect line and post metallization. As will be set forth in further detail below, the interconnect line pattern defines the regions in which primary conductor paths are provided for horizontal electrical interconnection in a plane of the workpiece, while the post pattern defines the regions in which primary conductor paths are provided for vertical electrical connections between adjacent planes of the workpiece.

Figure 5:
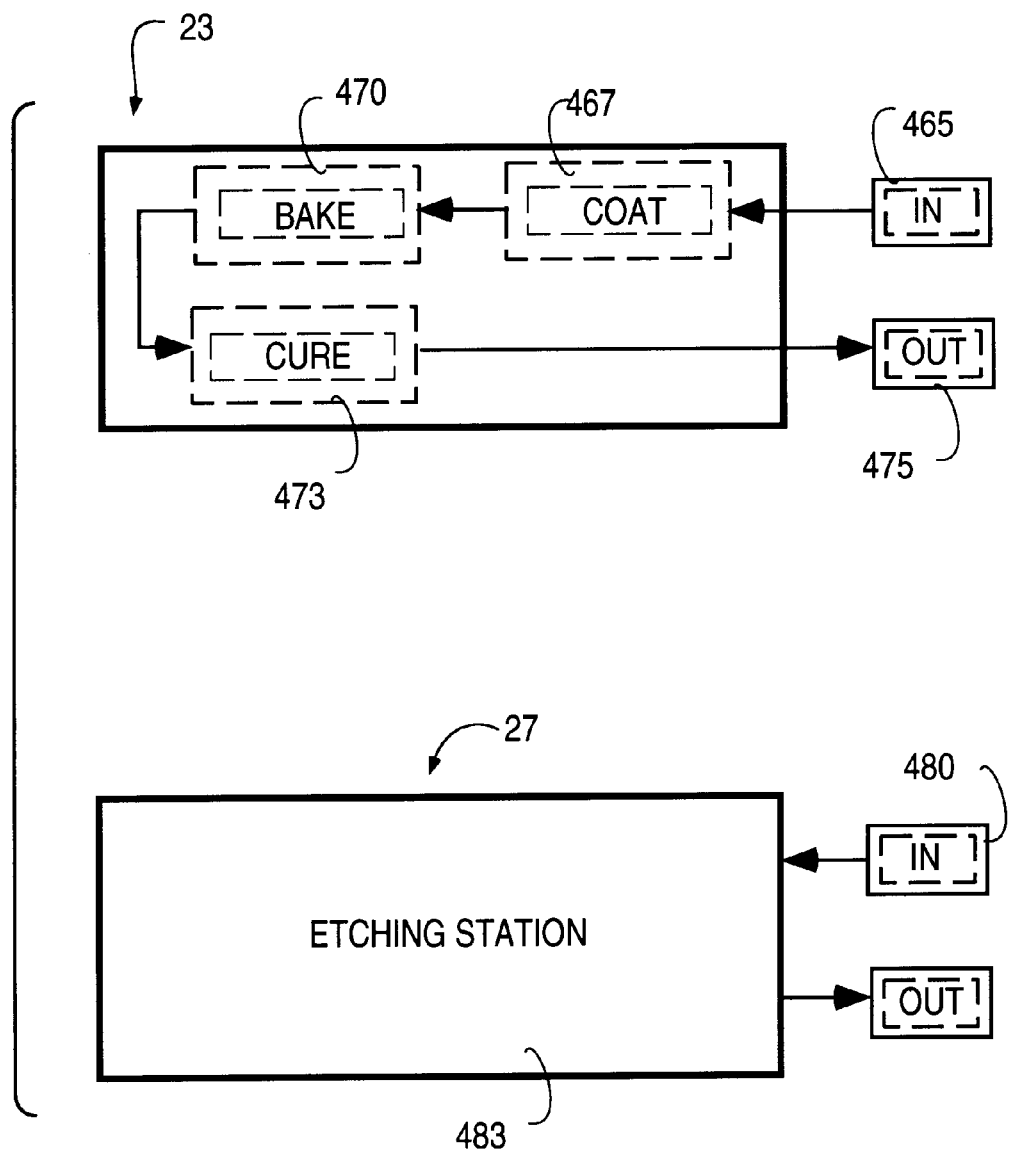

In the particular tool set embodiment illustrated in FIG. 5, the hard mask formation tool set 23 includes an input station 465 that preferably receives the workpieces in multi-workpiece cassettes or in single-workpiece or multi-workpiece hygienic pods. From the input station 465, a workpiece is provided to a coating station 467 where the workpiece is coated with one or more precursor materials. The workpiece is then provided to a baking station 470 to, for example, bake out solvents. The baking station 470 is typically a hot plate. After processing at the baking station 470, the workpiece is provided to a cure station 473. Depending on the duration of the cure cycle, the cure station 473 may be a hot plate or a small batch furnace. The curing cycle must not cause damage to the workpiece. After curing, the workpiece is provided to the output station 475. Although the illustrated embodiment is shown with separate input and output stations, the stations may be combined into a single input/output station.

The pattern processing tool set 25 of FIG. 3 includes a plurality of processing stations which are used to provide an interconnect line pattern over the hard mask layer applied by the hard mask formation tool set 23. In accordance with one of the disclosed processes, the pattern processing tool set 25 is also used to provide a post pattern over the interconnect metallization that is formed using the interconnect line pattern. Alternatively, as will be set forth below, the pattern processing tool set 25 is used to provide a post pattern over a further hard mask layer deposited by the hard mask formation tool set 23 which, in turn, provides a mask for the deposition of the post metallization.

In the tool set embodiment illustrated in FIG. 4, the pattern processing tool set 25 is a photolithography tool set. The pattern processing tool set 25, as such, includes an input station receiving workpieces, such as semiconductor wafers, in multi-workpiece cassettes or in single-workpiece or multi-workpiece hygienic pods. Within tool set 25 the workpieces sequentially undergo the standard photolithographic processes of conditioning, coating, and baking. After the photoresist is baked onto the workpiece, the workpiece is transferred to the input station of a photoresist exposure apparatus such as a step and repeat apparatus that exposes the photoresist to ultra-violet light in a manner that selectively affects the photoresist layer so that portions of the photoresist layer may be subsequently removed to form the interconnect line or post patterns. After exposure of the photoresist layer, the workpiece is provided to an output station for transfer to further processing stations that selectively remove the photoresist layer to form a pattern in the layer consistent with the pattern exposure in the photoresist exposure apparatus. Such processing stations include a photoresist development station and may include a plasma cleaning ("de-scum") station. After selective removal of the photoresist layer and plasma cleaning, the workpieces are transferred to an output station for provision to one or more further tool sets.

As shown in FIG. 5, the hard mask etch tool set 27 includes an input station 480 that preferably receives the workpieces in multi-workpiece cassettes or in single-workpiece or multi-workpiece hygienic pods. From the input station 480, a workpiece is provided to an etching station 483 where the hard mask layer is selectively etched through open regions of the patterned photoresist layer applied by the pattern processing tool set 25. After the hard mask layer has been etched to form the desired mask pattern, the workpiece is provided to output station 485. Although the embodiment shown in FIG. 5 illustrates separate input and output stations, a single input/output station may be used. The hard mask etch tool set 27 may be a plasma etch apparatus such as one sold by Tegal, Applied Materials, or LAM Research.

The electrochemical/wet processing tool set 30 of FIG. 3 implements a wide range of processes used to form the interconnect line metallization and post metallization structures. The wet processing tool set 30 may be implemented in an Equinox™ brand tool or an LT-210™ brand tool, both of which are available from Semitool, Inc., of Kalispell, Mont. As illustrated in FIG. 4, such an electrochemical/wet processing tool set preferably includes input and output stations and a plurality of stations for performing electrochemical and wet chemical processes. The processing stations of the wet processing tool set 30 perform at least three primary wet processing operations. First, the wet processing tool set 30 includes processing stations used to apply copper metallization, using an electrochemical deposition process, into the interconnect line pattern and the post pattern formed using the pattern processing tool set 25 and/or the hard mask etch tool set 27. Additionally, a conditioning station may be employed to condition surfaces of the workpiece that are to be electrochemically deposited with copper. Second, the tool set 30 includes one or more processing stations used to remove the hard mask material that is used to define the interconnect line pattern and, in some process embodiments, the post pattern that is applied by the hard mask formation tool set 23 and etched by the hard mask etch tool set 27. Similarly, the wet processing tool set 30 includes one or more processing stations used to remove the photoresist material that is employed to define the interconnect line pattern in the hard mask layer and, in some process embodiments, the photoresist material that is employed to define the post pattern. Typically, a solvent station and rinse/dry stations are provided for photoresist removal. Finally, one or more processing stations are employed to either remove portions of the seed layer and/or barrier layer that are not overlied by interconnect lines and/or to otherwise render such portions non-conductive.

Optionally, the processing tool 30 may be used to apply a protective coating over the interconnect line metallization and post metallization. In one specific embodiment, an electrochemical deposition station may be used for this purpose. Materials for the protective coating are preferably those which impede both copper migration into the dielectric and oxidation of the coated copper. Materials that may be employed for the protective coating include, for example, nickel, nickel alloys and chromium.

The dielectric processing tool set 35 includes a plurality of processing stations that are used to form a dielectric layer over the interconnect line metallization and post metallization. Additionally, the dielectric processing tool set 35 includes one or more processing stations for etching the deposited dielectric layer to expose upper connection regions of the post metallization. With respect to the specific embodiment of the dielectric processing tool set shown in FIG. 4, the workpieces are provided from an input station to a coating station where the surface of each workpiece is coated with a dielectric precursor or the like. After a workpiece has been coated, it is sequentially supplied to a baking station and a curing station to complete formation of a dielectric material that surrounds the interconnect line metallization and post metallization. The workpiece is then supplied to an etch back station where the upper surface of the dielectric layer is etched back to expose upper connection regions of the post metallization.

With reference to FIG. 3, the processing tool sets may be used to implement the manufacturing process procedures described below in connection with FIG. 6 with a minimal number of workpiece movements between the tool sets. Process steps 215, 225, 237 and 260 of FIG. 6 may be implemented in the film deposition tool set 20. Process steps 270 and 308 may be implemented in the pattern processing tool set 25. Process steps 277, 280, and 309 through 380 may be implemented in the wet processing tool set 30. Process steps 400 through 425 are implemented in the dielectric processing tool set 35. Process step 261 may be implemented in the hard mask formation tool set 23, and process step 273 may be implemented in the hard mask etching tool set 27.

Figure 11:
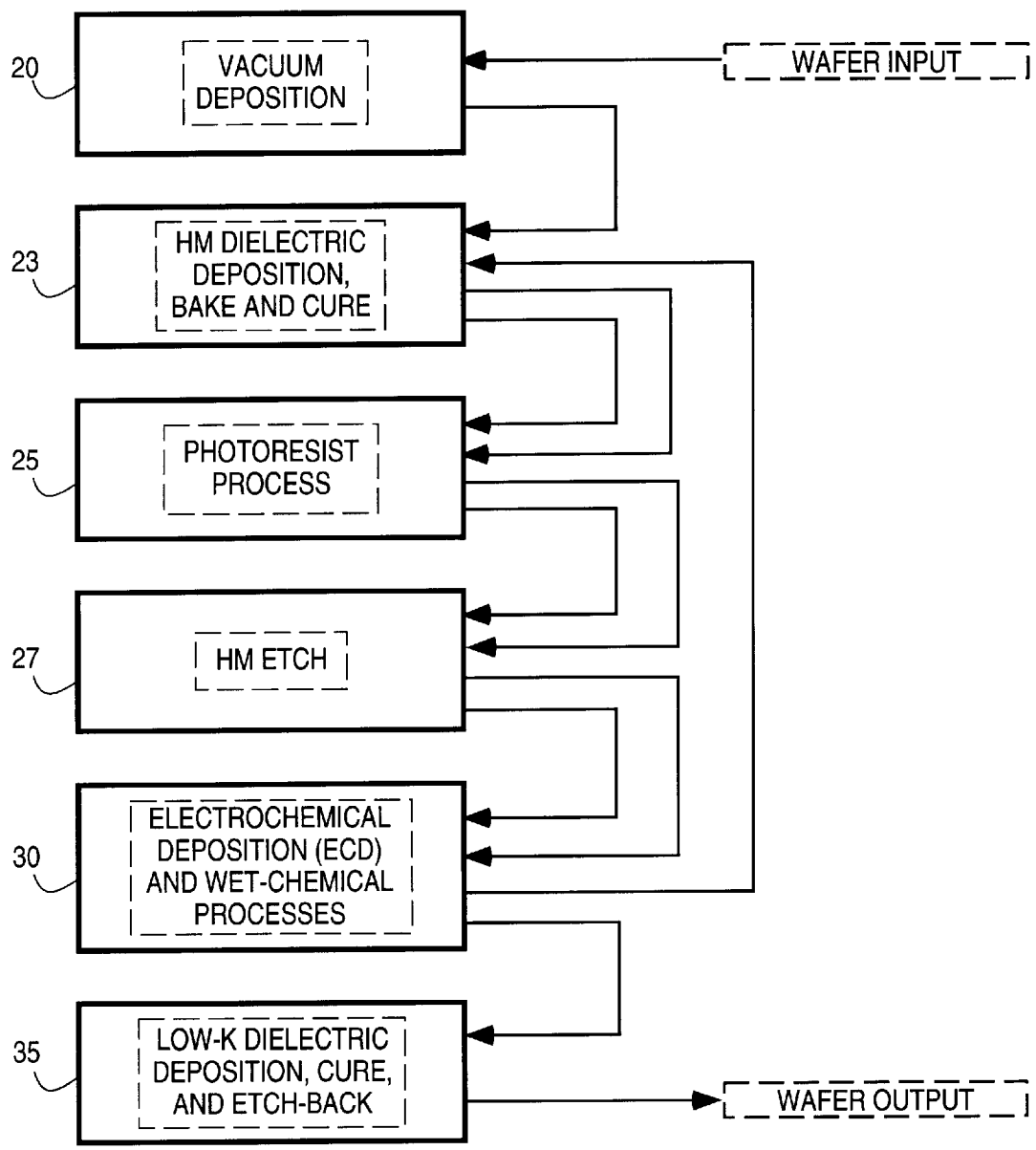
FIG. 11 illustrates a tool set configuration and corresponding workpiece movements for implementing the process shown in FIG. 10.

As a result of the particular processing steps utilized and the allocation of the processing steps among the various tool sets, a single interconnect metallization level may be formed with no more than seven workpiece movements between the tool sets when a hard mask is used to pattern only the interconnect lines. When a hard mask is used to pattern both the interconnect lines and the posts, a single interconnect metallization level, as shown in FIG. 11, may be formed with no more than nine workpiece movements.

Figure 2:
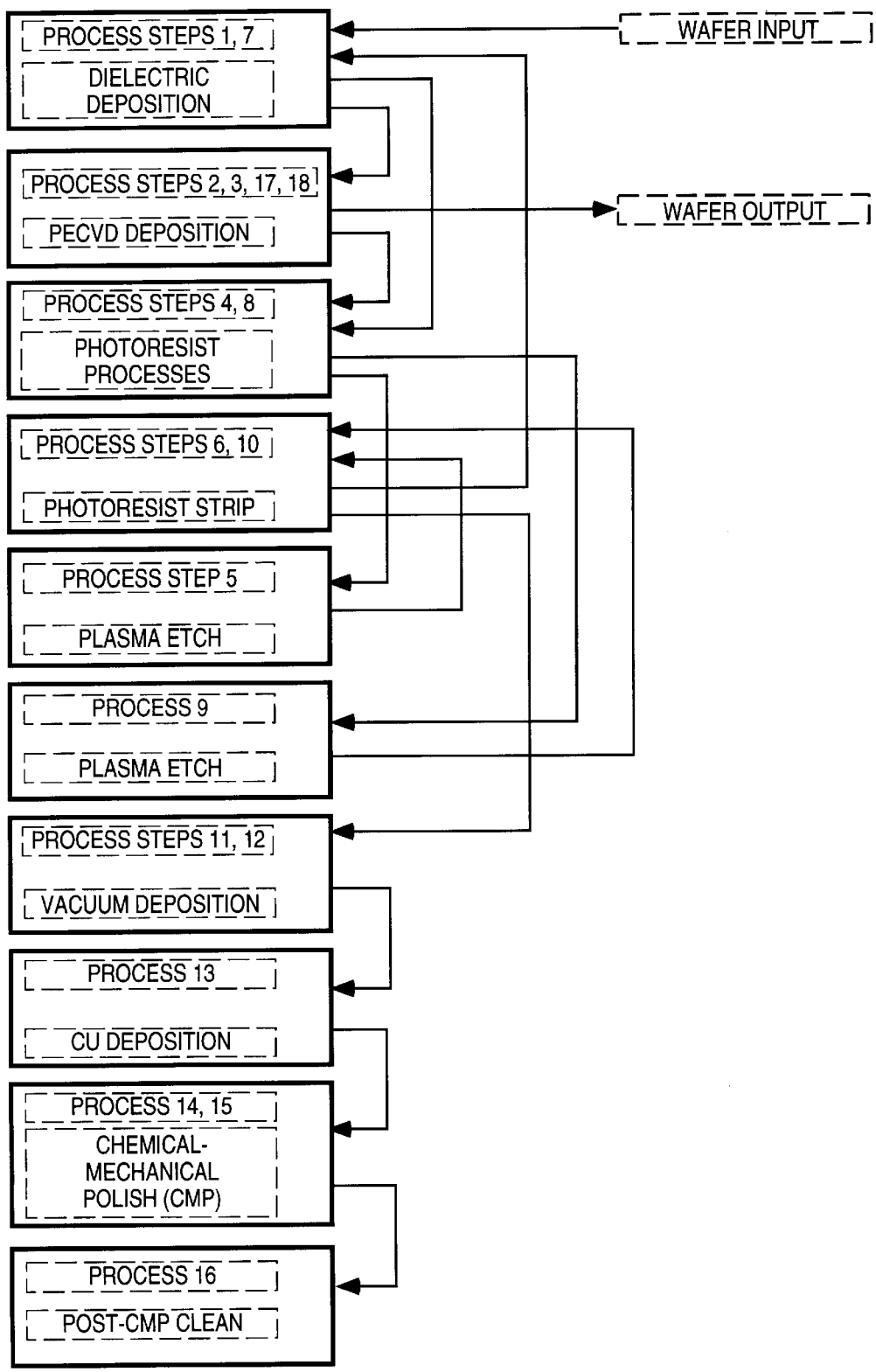
FIG. 2 illustrates a tool set configuration and corresponding workpiece movements for implementing the process shown in FIG. 1.

To this end, a single workpiece movement, designated at arrow 500 of FIG. 3, is employed for transferring the workpieces between the film deposition tool set 20 and the hard mask formation tool set 23. One workpiece movement, designated at arrow 505, is employed to transfer the workpieces between the hard mask formation tool set 23 and the pattern processing tool set 25. Two workpiece movements 510 and 512 are used to transfer the workpieces between the pattern processing tool set 25 and the wet processing tool set 30. A single workpiece movement 515 is used to transfer of the workpieces between the pattern processing tool set 25 and the hard mask etching tool set 27. Similarly, a single workpiece movement 517 is used to transfer the workpieces between the hard mask etching tool set 27 and the wet processing tool set 30. Finally, a single workpiece movement 520 is employed to transfer the workpieces between the wet chemical processing tool set 30 and the dielectric processing tool set 35. As such, there is a substantial reduction in the number of workpiece movements between the tool sets when compared to the traditional dual-damascene processing architecture and tool configuration of FIGS. 1 and 2.

Figure 6:
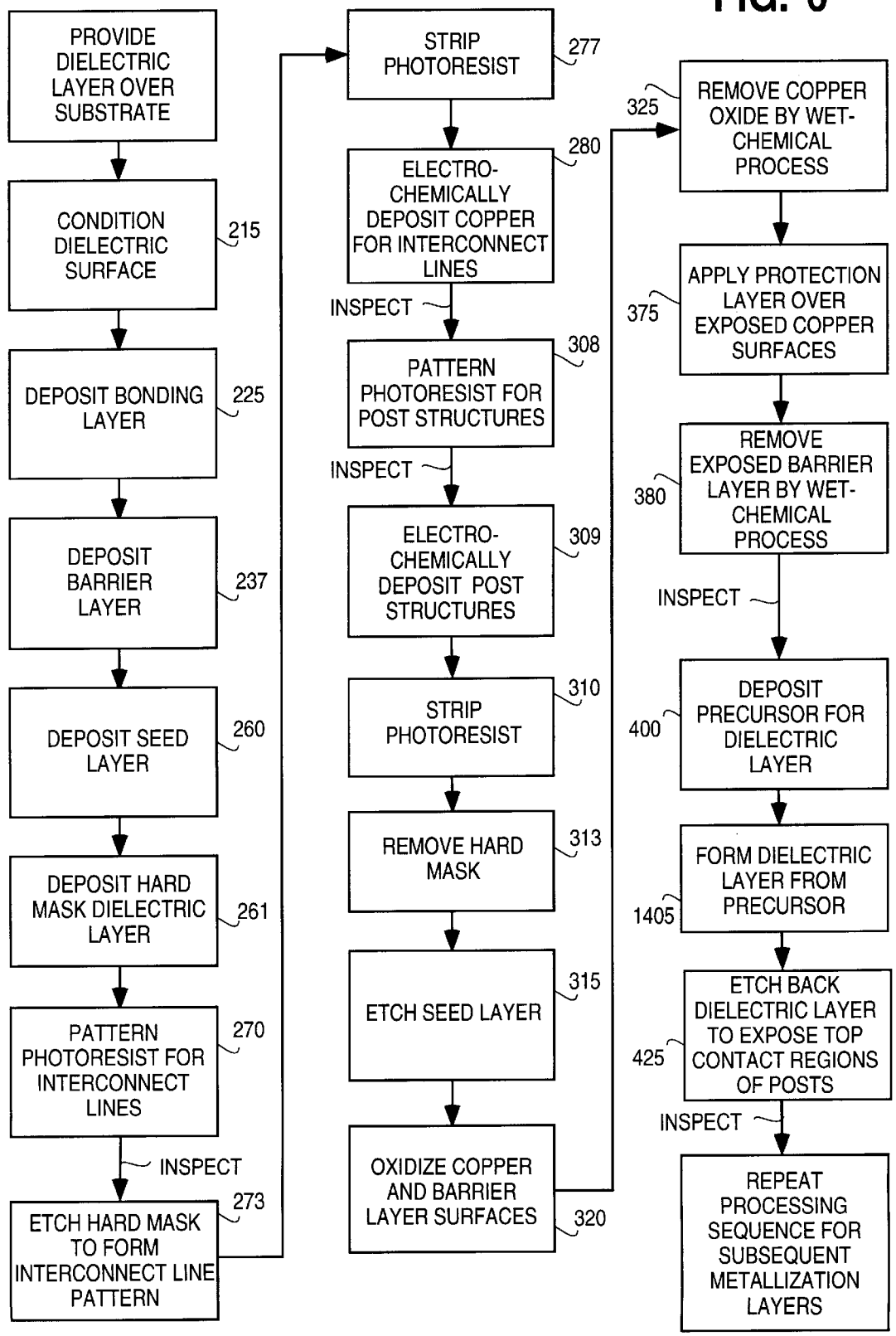
FIG. 6 is a process flow chart illustrating one manner of forming an interconnect metallization structure using a minimal number of workpiece movements between the tool sets shown in FIG. 3.

At step 261 of FIG. 6, a hard mask dielectric layer 263 is deposited over the seed layer 265 at the hard mask formation tool set 23. In step 270 of FIG. 6, procedures well-established in the photolithographic arts may be employed to deposit the interconnect line pattern over the hard mask dielectric layer 263 using, for example, photoresist as an intermediate mask. The hard mask dielectric layer 263 is then selectively etched through open portions of the photoresist layer 272 as shown by step 273. Step 273 takes place at the hard mask etching station 27. With reference to step 277 of FIG. 6, the photoresist layer 272 is removed at a wet chemical processing station within tool set 30 thereby leaving a patterned hard mask dielectric layer 263 having substantially vertical walls for defining the interconnect metallization pattern.

Referring to step 280 of FIG. 6, interconnect line metallization 285 is formed by selective electrochemical deposition of, for example, copper into the hard-mask interconnect pattern. An acidic chemical bath is preferably employed for the electrochemical depositions. The chemical bath may be prepared by adding copper sulfate and sulfuric acid to deionized water. As is well known in the metals-plating arts, small concentrations of materials which affect metal grain size and film conformability may optionally be included in the chemical bath.

The structure that results after the electrochemical deposition of the copper is illustrated in FIG. 7. In FIG. 7, the generally planar surface of the workpiece is illustrated at 210, a conditioned portion of the workpiece is illustrated at 230, the barrier layer is illustrated at 240, the hard mask layer is illustrated at 263, the seed layer is illustrated at 265, and an exemplary interconnect metallized line is illustrated in cross-section at 285.

After the interconnect metallization has been deposited into the patterned hard mask dielectric layer, the workpiece may be returned to the pattern processing tool set 25 where the pattern for the post metallization is formed using, for example, a photoresist layer that is applied and patterned using conventional photoresist patterning techniques. As at step 308, this further photoresist pattern is applied to the workpiece in order to form openings through which the post metallization may be electrochemically deposited. FIG. 8 illustrates the structure that results after patterning of a photoresist layer 305 and electrochemical deposition of the post metallization 307 at step 309 of FIG. 6.

After the post metallization has been deposited at step 309, the photoresist pattern is removed at step 310 and the hard mask dielectric layer is removed at step 313. Removal of the hard mask dielectric layer preferably takes place within tool set 30, but may also take place at the hard mask etching tool set 27 with the addition of two further wafer movements.

The hard mask dielectric layer 263 may be removed prior to the formation of the patterned photoresist layer. FIG. 9 illustrates the structure that results after patterning of a photoresist layer 305 and electrochemical deposition of the post metallization 307. In such instances, a treatment in HMDS may be employed to form a layer that promotes adhesion between photoresist 305 and the copper seed layer 265. Additionally, or alternatively, a thin (less than 100 Å) layer of copper oxide may be formed on the upper surface of the seed layer 265 to form layer 278 and thereby promote adhesion between the seed layer and photoresist.

Referring now to steps 315, 320, and 325 of FIG. 6, the seed layer 265 is partially or completely removed by, for example, an electrochemical etching process. Electrochemical etching may be accomplished by exposing the seed layer to a suitable electrolyte solution, such as a solution containing phosphoric acid, while the seed layer 265 is held at a positive electrical potential relative to an electrode that is immersed in the electrolyte solution.

At step 320, exposed surfaces of the copper structures 285, 307, and 265 and the barrier layer 240 are oxidized by exposure to water including dissolved air, oxygen, or ozone. Alternatively, the surfaces may be oxidized by heating in an oxygen containing atmosphere. As illustrated at step 325, the resultant copper oxide may be removed by exposure to a solution which contains sulfuric acid, hydrochloric acid, or both sulfuric and hydrochloric acid. Copper oxide removal may be accomplished, for example, at an etch station of tool set 30.

A protective coating is preferably provided over the remaining interconnect structures. Such a protective coating is preferably formed in an electrochemical process, such as at step 375, that causes a material to deposit on the exposed copper but not on the oxide-coated, exposed barrier material. Materials for the protective coating preferably include those which impede copper migration into the dielectric and, further, which impede oxidation of the coated copper. Such materials include nickel, nickel alloys and chromium. Preferred thicknesses for the protective coating are in the range of 50 Å to 500 Å.

Referring to step 380 of FIG. 6, the barrier layer 240 and its overlying oxide layer may be removed where it is not covered by an overlying copper feature by a wet-chemical etch. The wet chemical etch may comprise a dilute acid, such as solution of 1% to 5% hydrofluoric acid in water, provided that the barrier removal procedure does not excessively attack either copper line and post features 285 and 307 or the dielectric 210 that underlies the barrier layer 240.

At step 400 of FIG. 6, a further dielectric layer is formed to a thickness sufficient to cover the upper surfaces of the posts of the interconnect structure. The further dielectric layer is preferably formed by spin application or spray application of a precursor material or precursor materials followed by a cure, in either an anaerobic or in an oxygen-containing atmosphere, at a temperature of less than 450 C. Composition of the dielectric layer may be different than or the same as the composition of the dielectric layer 210.

After the further dielectric layer has been cured, the upper surface of the layer is etched back to expose upper contact regions of the post structure 307. For example, a blanket plasma etch may be employed to reduce the thickness of layer until all upper surfaces of the post structures 307 are exposed. Etching of BCB, for example, may be done in a plasma that contains oxygen and fluorine ions.

Figure 10:
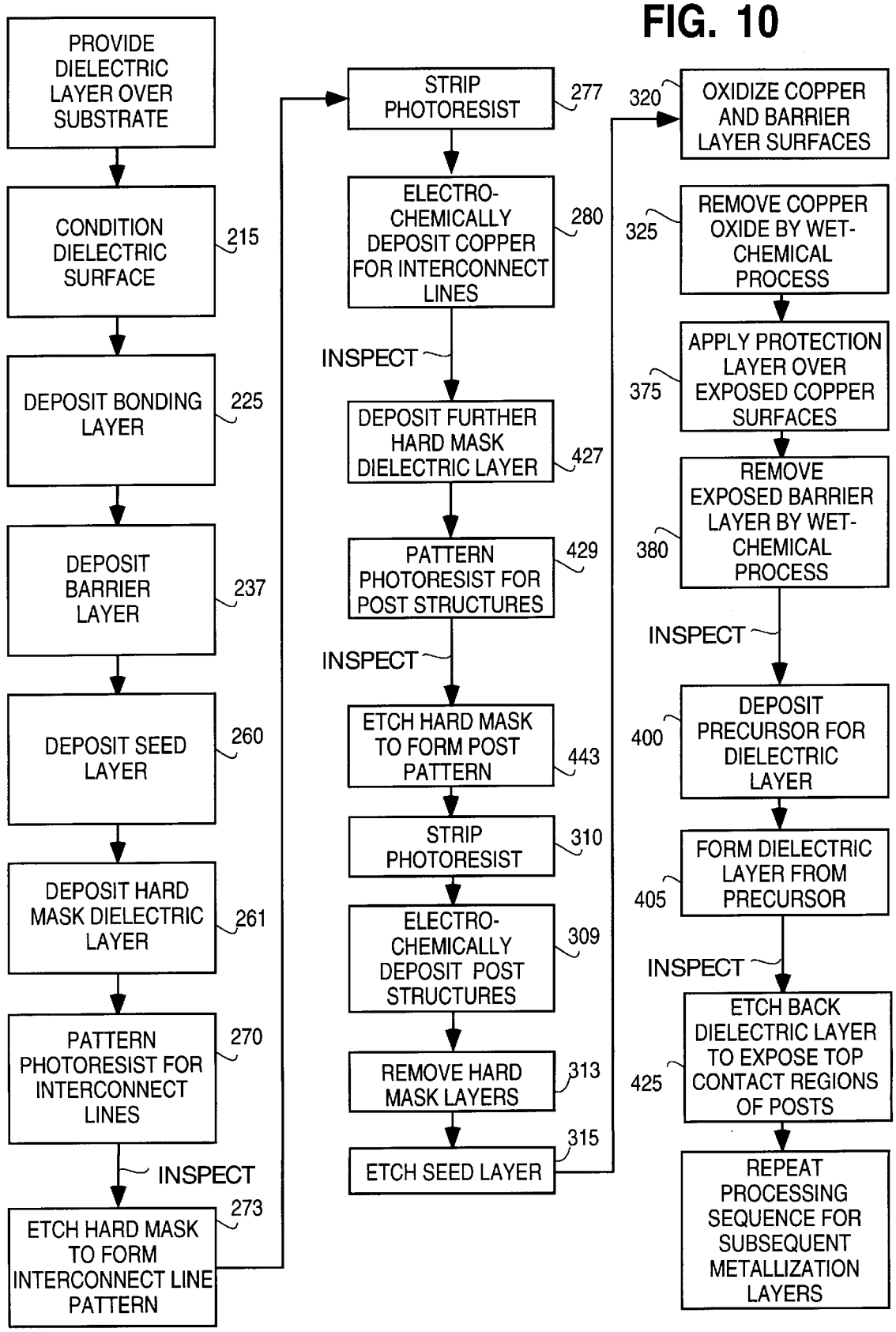
FIG. 10 is a process flow chart illustrating a further manner of implementing an interconnect metallization structure using a minimal number of workpiece movements.

In some instances, it may be desirable to use a hard mask for patterning the posts as well as the interconnect lines. One embodiment of a process that utilizes a hard mask for patterning the post structures is illustrated in FIG. 10. The corresponding wafer movements between the tool sets are illustrated in FIG. 11.

Figure 12:
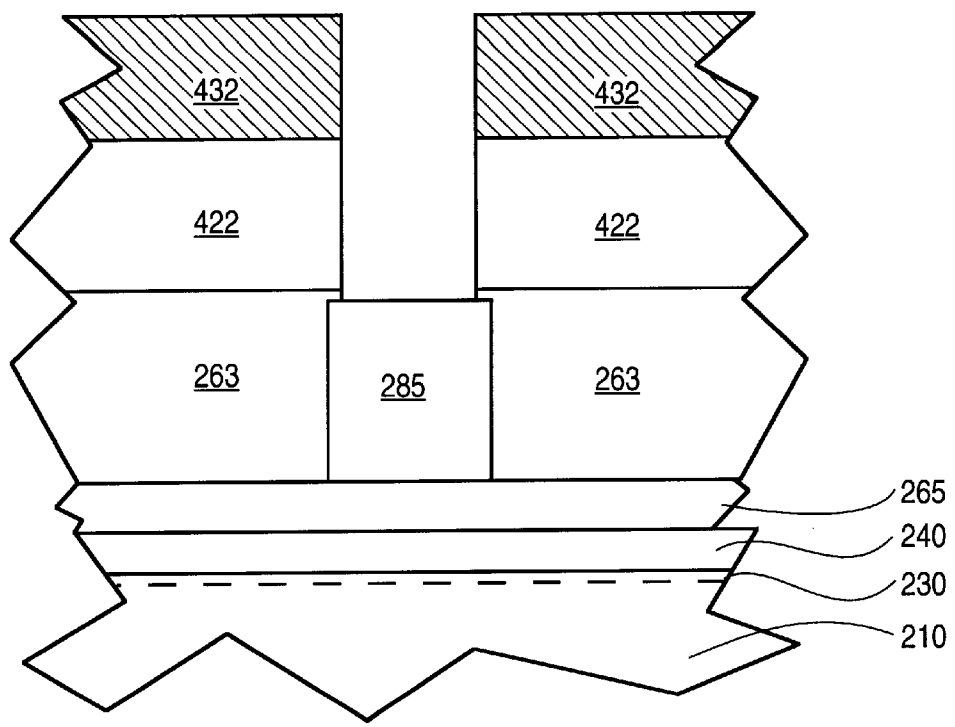
FIGS. 12 and 13 illustrate an interconnect metallization structure formed using the process of FIG. 10 at selected stages of the metallization level development.
Figure 13:
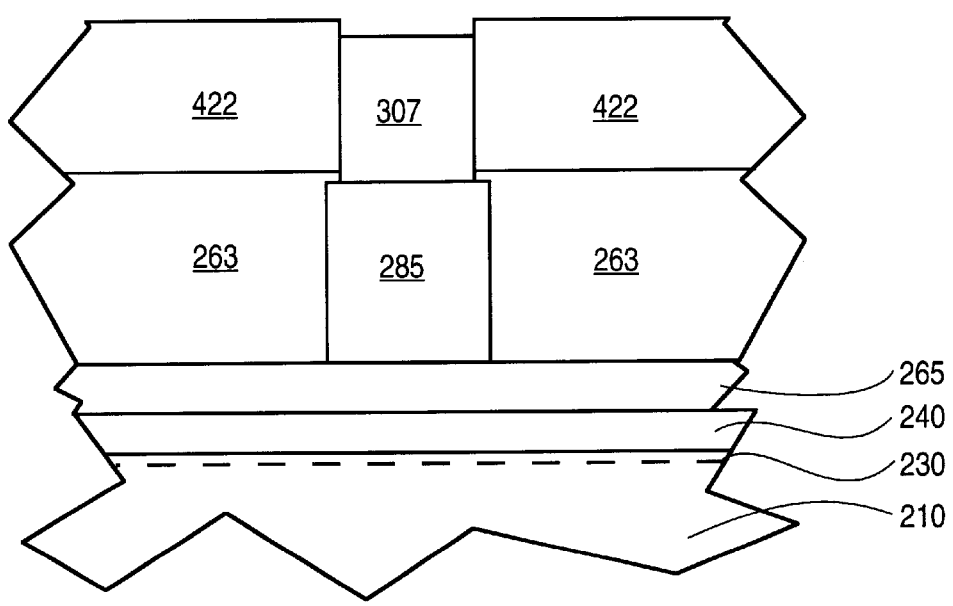

In this embodiment, the processing of the workpiece is substantially similar to the processing illustrated in FIG. 6. In terms of processing, the principal difference occurs after electrochemical deposition step 280. In this latter embodiment, the workpiece is removed from the wet processing tool set 30 and returned to the hard mask formation tool set 23 wherein a further hard mask dielectric layer 422 (FIG. 12) is disposed over the surface of the workpiece as illustrated at step 427 of FIG. 10. After formation of the further hard mask dielectric layer 422, the workpiece is transferred to the pattern forming tool set 25 where, for example, a further photoresist layer 432 is disposed over the further hard mask dielectric layer 422 and patterned, as step 429, in accordance with the desired post metallization pattern. The hard mask dielectric layer 422 is then etched in accordance with this pattern at step 443 to form the openings in which the post structures will be formed. The workpiece is then returned to the wet chemical processing tool set 30 where the photoresist layer 432 is stripped at step 310 and the copper post structures are electrochemically deposited through the hard mask dielectric layer 422 at step 309. With reference to FIG. 13, after electrochemical deposition of the post metallization, the hard mask layers are removed, and processing proceeds in the same manner as set forth in connection with the process of FIG. 6. As illustrated in FIG. 11, the entire metallization level can be formed with nine wafer movements between the illustrated tool sets.

Figure 14:
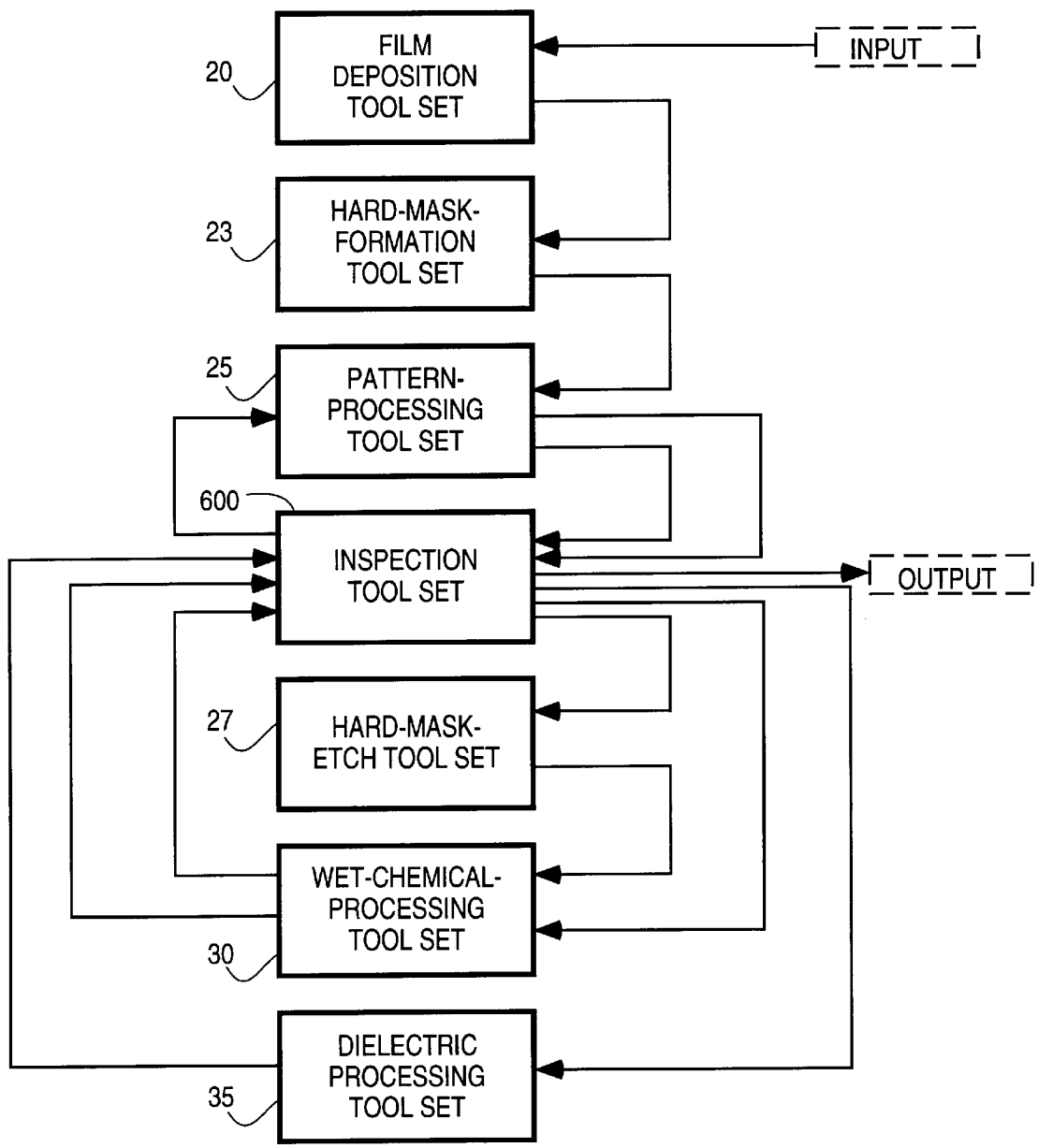

Further enhancements to each of the foregoing processes and tool sets/wafer movements are illustrated in FIGS. 14 and 15. The tool configurations of FIGS. 14 and 15 each include an inspection tool set 600 that is used to check the workpieces at intermediate stages of the application of a single metallization level. The intermediate checks are used, for example, to insure proper registration of the various photoresist and/or hard mask patterns and corresponding metallization and, further, to insure proper dielectric etchback. As shown in FIG. 14, each workpiece may be provided to the inspection tool set 600 after processing steps 270, 280, 308, 380 and 425 that are illustrated in FIG. 6. Similarly, as shown in FIG. 15, each workpiece may be provided to the inspection tool set 600 after processing steps 270, 280, 429, 380 and 425 that are illustrated in FIG. 11. In the embodiment illustrated in FIG. 14, twelve workpiece movements are used to transfer the workpiece between the various tools of the tool processing architecture to form a single interconnect metallization level. In the embodiment illustrated in FIG. 15, fourteen workpiece movements are used to transfer the workpiece between the various tools of the tool processing architecture to form a single interconnect metallization level. The inspection tool set 600 may be implemented, for example, with inspection devices available from KLA-Tencor.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A manufacturing tool configuration for applying one or more levels of interconnect metallization to a generally planar dielectric surface of a workpiece, the tool configuration comprising:

a film deposition tool set for depositing a barrier layer exterior to the planar dielectric surface and for depositing a seed layer exterior to the barrier layer;

a hard mask formation tool set for forming a hard mask dielectric layer exterior to the seed layer;

a pattern processing tool set for providing an interconnect line pattern over the hard mask dielectric layer and for providing a post pattern over interconnect line metallization formed using the interconnect line pattern;

a hard mask etching tool set for etching exposed regions of the hard mask dielectric layer after formation of the interconnect line pattern thereover;

a wet processing tool set for performing at least the following wet processing operations,
applying copper metallization, using an electrochemical deposition process, into the interconnect line pattern defined in the hard mask and the post pattern defined by the pattern material used by the pattern processing tool set, removing material applied by the pattern processing tool set to form the interconnect line pattern and the post pattern, removing the hard mask dielectric layer, removing portions of the seed layer and the barrier layer that are not overlied by interconnect line metallization; and a dielectric processing tool set for depositing a dielectric layer over the interconnect line metallization and post metallization and for etching the deposited dielectric layer to expose upper connection regions of the post metallization;

a single metallization level comprising the interconnect line metallization, the post metallization, and the dielectric layer being formed using no more than twelve workpiece movements between the tool sets.

2. A manufacturing tool configuration as claimed in claim 1 wherein the wet processing tool set comprises at least one processing station for applying an electrochemically deposited protective coating exterior to the copper metallization.

3. A manufacturing tool configuration as claimed in claim 1 wherein the wet processing tool set comprises at least one processing station for conditioning a surface of the workpiece prior to further processing within the wet processing tool set.

4. A manufacturing tool configuration as claimed in claim 1 wherein the wet processing tool set comprises at least one processing station for oxidizing exposed metallized portions of the workpiece.

5. A manufacturing tool configuration as claimed in claim 4 wherein the wet processing tool set comprises at least one processing station for removing oxidized metal portions of the workpiece.

6. A manufacturing tool configuration as claimed in claim 5 wherein the at least one processing station for removing oxidized metal portions is also employed for conditioning of surfaces prior to subsequent processing.

7. A manufacturing tool configuration as claimed in claim 1 wherein the film deposition tool set is a vacuum deposition tool set.

8. A manufacturing tool configuration as claimed in claim 1 wherein the film deposition tool set deposits a substantially planar bonding layer, the barrier layer being deposited by the film deposition tool set over the bonding layer.

9. A manufacturing tool configuration as claimed in claim 1 wherein the film deposition tool set deposits a substantially planar bonding layer directly on the dielectric layer.

10. A manufacturing tool configuration as claimed in claim 1 wherein the pattern processing tool set is a photoresist processing tool set.

11. A manufacturing tool configuration as claimed in claim 1 wherein the dielectric deposition tool set deposits a low-K dielectric material.

12. A manufacturing tool configuration as claimed in claim 1 wherein the film deposition tool set is a single integrated tool.

13. A manufacturing tool configuration as claimed in claim 1 wherein the pattern processing tool set is a single integrated tool.

14. A manufacturing tool configuration as claimed in claim 1 wherein the dielectric deposition tool set is a single integrated tool.

15. A manufacturing tool configuration as claimed in claim 1 wherein the electrochemical/wet processing tool set is a single integrated tool.

16. A manufacturing tool configuration as claimed in claim 1 and further comprising an inspection tool set for inspecting the workpiece at one or more processing states during formation of a single metallization level.

17. A manufacturing tool configuration as claimed in claim 16 wherein the wet processing tool set comprises at least one processing station for applying an electrochemically deposited protective coating exterior to the copper metallization.

18. A manufacturing tool configuration as claimed in claim 16 wherein the wet processing tool set comprises at least one processing station for conditioning a surface of the workpiece prior to further processing within the wet processing tool set.

19. A manufacturing tool configuration as claimed in claim 16 wherein the wet processing tool set comprises at least one processing station for oxidizing exposed metallized portions of the workpiece.

20. A manufacturing tool configuration as claimed in claim 19 wherein the wet processing tool set comprises at least one processing station for removing oxidized metal portions of the workpiece.

21. A manufacturing tool configuration as claimed in claim 20 wherein the at least one processing station for oxidizing and the at least one processing station for removing oxidized metal portions are the same processing station.

22. A manufacturing tool configuration as claimed in claim 16 wherein the film deposition tool set is a vacuum deposition tool set.

23. A manufacturing tool configuration as claimed in claim 16 wherein the film deposition tool set deposits a substantially planar bonding layer, the barrier layer being deposited by the film deposition tool set over the bonding layer.

24. A manufacturing tool configuration as claimed in claim 16 wherein the film deposition tool set deposits a substantially planar bonding layer directly on the dielectric layer.

25. A manufacturing tool configuration as claimed in claim 16 wherein the pattern processing tool set is a photoresist processing tool set.

26. A manufacturing tool configuration as claimed in claim 16 wherein the dielectric deposition tool set deposits a low-K dielectric material.

27. A manufacturing tool configuration as claimed in claim 16 wherein the film deposition tool set is a single integrated tool.

28. A manufacturing tool configuration as claimed in claim 16 wherein the pattern processing tool set is a single integrated tool.

29. A manufacturing tool configuration as claimed in claim 16 wherein the dielectric deposition tool set is a single integrated tool.

30. A manufacturing tool configuration as claimed in claim 16 wherein the inspection tool set inspects the workpiece to ensure proper registration of the interconnect line metallization and the post pattern formed by the pattern processing tool set.

31. A manufacturing tool configuration as claimed in claim 16 wherein the inspection tool set inspects the workpiece to ensure proper dielectric etching by the dielectric processing tool set.

32. A manufacturing tool configuration for applying one or more levels of interconnect metallization to a generally planar dielectric surface of a workpiece, the tool configuration comprising:

film deposition tool set for depositing a barrier layer exterior to the planar dielectric surface and for depositing a seed layer exterior to the barrier layer;

a hard mask formation tool set for forming a hard mask dielectric layer exterior to the seed layer;

a pattern processing tool set for providing an interconnect line pattern over the hard mask dielectric layer and for providing a post pattern over interconnect line metallization formed using the interconnect line pattern;

a hard mask etching tool set for etching exposed regions of the hard mask dielectric layer after formation of the interconnect line pattern thereover;

a wet processing tool set for performing at least the following wet processing operations, applying copper metallization, using an electrochemical deposition process, into the interconnect line pattern and the post pattern formed using the pattern processing tool set, removing material applied by the pattern processing tool set to form the interconnect line pattern and the post pattern, removing the hard mask dielectric layer, removing portions of the seed layer and the barrier layer that are not overlied by interconnect line metallization; and a dielectric processing tool set for depositing a dielectric layer over the interconnect line metallization and post metallization and for etching the deposited dielectric layer to expose upper connection regions of the post metallization;

a single metallization level comprising the interconnect line metallization, the post metallization, and the dielectric layer being formed using no more than seven workpiece movements between the tool sets.

33. A manufacturing tool configuration as claimed in claim 32 wherein the wet processing tool set comprises at least one processing station for applying an electrochemically deposited protective coating exterior to the copper metallization.

34. A manufacturing tool configuration as claimed in claim 32 wherein the wet processing tool set comprises at least one processing station for conditioning a surface of the workpiece prior to further processing within the wet processing tool set.

35. A manufacturing tool configuration as claimed in claim 32 wherein the wet processing tool set comprises at least one processing station for oxidizing exposed metallized portions of the workpiece.

36. A manufacturing tool configuration as claimed in claim 35 wherein the wet processing tool set comprises at least one processing station for removing the oxidized metal portions of the workpiece.

37. A manufacturing tool configuration as claimed in claim 36 wherein the at least one processing station for removing oxidized metal portions is also employed for conditioning of surfaces prior to subsequent processing.

38. A manufacturing tool configuration as claimed in claim 32 wherein the film deposition tool set is a vacuum deposition tool set.

39. A manufacturing tool configuration as claimed in claim 32 wherein the film deposition tool set deposits a substantially planar bonding layer, the barrier layer being deposited by the film deposition tool set over the bonding layer.

40. A manufacturing tool configuration as claimed in claim 32 wherein the film deposition tool set deposits a substantially planar bonding layer directly on the dielectric layer.

41. A manufacturing tool configuration as claimed in claim 32 wherein the pattern processing tool set is a photoresist processing tool set.

42. A manufacturing tool configuration as claimed in claim 32 wherein the dielectric deposition tool set deposits a low-K dielectric material.

43. A manufacturing tool configuration as claimed in claim 32 wherein the film deposition tool set is a single integrated tool.

44. A manufacturing tool configuration as claimed in claim 32 wherein the pattern processing tool set is a single integrated tool.

45. A manufacturing tool configuration as claimed in claim 32 wherein the dielectric deposition tool set is a single integrated tool.

46. A manufacturing tool configuration as claimed in claim 32 wherein the electrochemical/wet processing tool set is a single integrated tool.

47. A manufacturing tool configuration for applying one or more levels of interconnect metallization to a generally planar dielectric surface of a workpiece, the tool configuration comprising:

a film deposition tool set for depositing a barrier layer exterior to the planar dielectric surface and for depositing a seed layer exterior to the barrier layer;

a hard mask formation tool set for forming a first hard mask dielectric layer exterior to the seed layer and for forming a second hard mask dielectric layer exterior to the first hard mask dielectric layer;

a pattern processing tool set for providing an interconnect line pattern over the first hard mask dielectric layer and for providing a post pattern over a second hard mask dielectric layer;

a hard mask etching tool set for etching exposed regions of the first hard mask dielectric layer after formation of the interconnect line pattern thereover and the second hard mask dielectric layer after formation of the post pattern thereover;

a wet processing tool set for performing at least the following wet processing operations, applying copper metallization, using an electrochemical deposition process, into the interconnect line pattern defined in the first hard mask and into the post pattern defined in the second hard mask, removing material applied by the pattern processing tool set to form the interconnect line pattern and the post pattern on the hard mask dielectric layers, removing the hard mask dielectric layers, removing portions of the seed layer and the barrier layer that are not overlied by interconnect line metallization; and a dielectric processing tool set for depositing a dielectric layer over the interconnect line metallization and post metallization and for etching the deposited dielectric layer to expose upper connection regions of the post metallization;

a single metallization level comprising the interconnect line metallization, the post metallization, and the dielectric layer being formed using no more than nine workpiece movements between the tool sets.

* * * * *